(12) United States Patent
Tatsumi et al.

(10) Patent No.: US 8,063,114 B2
(45) Date of Patent: Nov. 22, 2011

(54) INORGANIC MESOPOROUS MATERIAL HAVING CHIRAL TWISTED STRUCTURE AND PROCESS FOR PRODUCING THE SAME

(75) Inventors: Takashi Tatsumi, Kanagawa (JP); Shunai Che, Shanghai (CN); Kazutami Sakamoto, Kanagawa (JP)

(73) Assignee: Japan Science and Technology Agency, Saitama (JP)

( * ) Notice: Subject to any disclaimer, the term of this patent is extended or adjusted under 35 U.S.C. 154(b) by 697 days.

(21) Appl. No.: 11/579,203

(22) PCT Filed: Apr. 28, 2005

(86) PCT No.: PCT/JP2005/008233
§ 371 (c)(1),
(2), (4) Date: Sep. 11, 2008

(87) PCT Pub. No.: WO2005/105672
PCT Pub. Date: Nov. 10, 2005

(65) Prior Publication Data
US 2009/0043003 A1 Feb. 12, 2009

(30) Foreign Application Priority Data
Apr. 30, 2004 (JP) ................ 2004-136600

(51) Int. Cl.
*C08G 77/00* (2006.01)
*C08G 63/44* (2006.01)
(52) U.S. Cl. ......... 521/154; 521/183; 521/184; 556/413
(58) Field of Classification Search .................. 521/124, 521/138, 154; 556/413; 427/255.28
See application file for complete search history.

(56) References Cited

U.S. PATENT DOCUMENTS
2004/0267038 A1* 12/2004 Tatsumi et al. ............... 556/413

FOREIGN PATENT DOCUMENTS
| CN | 1569632 A | 1/2005 |
| JP | 2000-233995 | 8/2000 |
| JP | 2001-253705 | 9/2001 |

OTHER PUBLICATIONS

Che et al., "A novel anionic surfactant templating route for synethsizing mesoporous silica with unique structure." Nov. 23, 2003. Nature Materials, vol. 2, Dec. 2003. pp. 801-804.*
Dujardin et al., J. Mater. Chem., 13:696-699 (2003).
Che et al., Nature Materials, 2:801-805 (2003).
First Office Action from corresponding Chinese Application No. 200580013817.1, based on corresponding application PCT/JP2005/008233 (translation included), Jul. 9, 2008.

* cited by examiner

*Primary Examiner* — Robert Sellers
*Assistant Examiner* — Kara Negrelli
(74) *Attorney, Agent, or Firm* — Peter F. Corless; Christine C. O'Day; Edwards Wildman Palmer LLP

(57) ABSTRACT

A chiral inorganic mesoporous material characterized by having a chiral twisted structure and being mesoporous; a process for producing the material; and a method of using the material. The process for inorganic mesoporous material production is a method in which one or more polymerizable inorganic monomers selected from the group consisting of polymerizable inorganic monomers and polymerizable inorganic monomers having a functional group capable of having a charge are polymerized in the presence of a solvent using as a template a self-assembly of a chiral surfactant such as an N-(higher alkanoyl)amino acid salt. Examples of the use of the inorganic mesoporous material include the separation of racemates and reaction fields for asymmetric syntheses.

14 Claims, 8 Drawing Sheets

INORGANIC MESOPOROUS MATERIAL HAVING CHIRAL TWISTED STRUCTURE AND PROCESS FOR PRODUCING THE SAME

TECHNICAL FIELD

The present invention relates to a novel mesoporous material, preferably an inorganic mesoporous material, having a mesoporous structure and also chirality due to a twisted molecular structure and a process for producing the same, and the use of the same. In more detail, the present invention relates to a process for producing an inorganic mesoporous material having a chiral twisted structure, including polymerizing one or two or more polymerizable inorganic monomers selected from the group consisting of polymerizable inorganic monomers and polymerizable inorganic monomers having a functional group capable of having a charge in the presence of a solvent using self-assembly of a chiral surfactant as a template, an inorganic mesoporous material which can be produced with this process, and a manufacturing process, a chemical synthesis process, and separation and concentration processes of a metallic nano-wire using the inorganic mesoporous material.

BACKGROUND ART

The characteristic in which a pair of objects reflected in a mirror cannot be superimposed on its reflection such as a right hand and a left hand, is said that the object has chirality, and such a material is called a chiral material. Many chiral materials including various kinds of compounds constituting an living organism, sugar, DNA, amino acid, and protein are known in nature. Known examples of the chiral materials include a case where the chirality exists in a molecule itself, for example such as materials in which the chirality is due to the existence of an asymmetric carbon atom and a case where the chirality is based on the asymmetry of a whole molecule such as substituted allene. Further, there are materials in which chirality occurs due to the existence of an asymmetry in the three-dimensional structure of a molecule although the chirality does not exist in the molecule itself. For example, DNA is known to have a helical structure, and it is well known that the dextrality and sinistrality exist in this helical structure, thereby generating chirality. Further, a crystal of quartz is well known to have chirality based on the asymmetry of the crystal form.

Although organisms existing on the earth are made from chiral amino acids, and the importance of chirality in physiological activities is well known, it is very difficult to synthesize a chiral material selectively. Professor Noyori and others who discovered a process for synthesizing a chiral molecule catalytically from a non-chiral molecule received a Nobel Prize.

Because many physiologically active materials such as pharmaceuticals and agrichemicals are organic compounds, much research on the process of synthesizing the organic compounds stereo-selectively or on the asymmetric synthesis has been performed. However, the example of synthesizing a chiral inorganic material artificially is very rare, and only syntheses of zeolite having pores of a size of the order of atom and a zeolite-like material with a three-dimensional helical structure are reported (refer to Non-Patent Documents 1 to 3). A chiral inorganic material having mesoporous pores which can take in a bulky organic compound has never been known (refer to Non-Patent Document 4).

The inorganic material having a chiral pore is expected to be used as a reaction field for the synthesis of a chiral molecule from a non-chiral molecule and as a separation agent for extracting one chiral molecule from a racemate. And at the same time, the novel use due to the chirality itself is expected to be spread.

For example, nano-technology which has developed in recent years has provided many nano-scaled materials. Although the technologies such as nano-wires, nano-tubes, and a dendrimer have received attention as micro-functional materials utilizing functions of material in nano-scale, none of these materials have a chirality and only the function as a material has been targeted. When these nano-scaled materials have chirality, new functions due to the biospecific property and chirality are expected to be added, and the development of a chiral material is desired also in a nano-technology.

A variety of developments to produce a chiral inorganic material having ordered pores such as silica have been performed. For example, an optically active anionic surfactant such as N-acyl-L-alanine is reported to form a chiral nematic phase in the presence of a small amount of higher alcohol (refer to Non-Patent Documents 5 and 6). The inventors of the present invention have examined a process for synthesizing a chiral inorganic material having ordered pores using such a nematic phase as a template (refer to Non-Patent Document 7).

Non-Patent Document 1: Davis, M. E., Acc. Chem, Res., 26, 111-115 (1993)
Non-Patent Document 2: Gier, T. E., et. al., Nature, 395, 154-157 (1998)
Non-Patent Document 3: Wang, Y., et. al., Angew. Chem. Int. Ed., 42, 4089-4092 (2003)
Non-Patent Document 4: Davis, M. E., Nature, 417, 813-821 (2002)
Non-Patent Document 5: Tracey, A. S. & Zhang, X., J. Phys. Chem., 96, 3889 (1992)
Non-Patent Document 6: Acharya, D. E., et. al., J. Oleo. Sci., 52, 407 (2003)
Non-Patent Document 7: Che, S., et. al., Nature Materials, 2, 801 (2003)

DISCLOSURE OF THE INVENTION

Problem to be Solved by the Invention

The object of the present invention is to provide a chiral inorganic material having ordered mesoporous pores and a process for producing the same. In more detail, the present invention provides a chiral inorganic material based on a twisted structure of an inorganic linear molecule and a process for producing the same. Further, the present invention provides the novel use due to the inorganic material as such.

Means for Solving the Problem

The inventors of the present invention have examined a process for synthesizing a chiral inorganic material having ordered mesopores (defined as 2 to 50 nm pores under IUPAC definition) using a chiral nematic phase by an anionic surfactant as a template (refer to Non-Patent Document 7). As a result, the inventors of the present invention finally succeeded in producing a novel mesoporous material, preferably an inorganic mesoporous material, having a mesoporous structure and chirality due to a twisted molecular structure. The inorganic material having a mesoporous structure and being chiral provided by the present invention is a highly functional material and a novel material which has not been reported in any documents.

That is, the present invention relates to a process for producing an inorganic mesoporous material having a chiral twisted structure, including polymerizing one or two or more polymerizable inorganic monomers selected from the group consisting of polymerizable inorganic monomers and polymerizable inorganic monomers having a functional group capable of having a charge in the presence of a solvent using a self-assembly of a chiral surfactant as a template.

Further, the present invention relates to a chiral inorganic mesoporous material substantially composed of an inorganic polymer which can be produced with the above-described process in the present invention, having a chiral twisted structure, and being mesoporous.

Furthermore, the present invention relates to the use of the above-described chiral mesoporous material in the present invention. In more detail, the present invention relates to a process for producing a chiral inorganic mesoporous material complex containing the metallic nano-wire by chemically or physically fixing a metal to the surface of the pore of the chiral inorganic mesoporous material of the present invention. Moreover, the present invention relates to a process of manufacturing a metallic nano-wire including removing an inorganic mesoporous material from the chiral inorganic mesoporous material complex containing the metallic nano-wire which is produced with this process. Further, the present invention relates to a process of synthesizing a chiral material from a chiral raw material, a non-chiral raw material, or a racemic raw material, by performing a chemical reaction inside the pores of the chiral inorganic mesoporous material in the present invention. Furthermore, the present invention relates to a process of concentrating or separating the specific chiral material from a chiral material or a racemic material using the chiral inorganic mesoporous material of the present invention.

The chiral inorganic mesoporous material of the present invention, which is a material substantially composed of an inorganic polymer, has the new characteristic of which it has a mesoporous structure and chirality based on a twisted structure of an inorganic molecular chain which is polymerized.

The mesoporous structure in the present invention is a structure which has pores having a size that the pore can incorporate a low-molecular compound. Specifically, examples of the average diameter of the pore are 2 to 50 nm, 2 to 20 nm, and 2 to 10 nm, preferably about 2 to 8 nm.

"Chiral" in the present invention does not have to be optically pure as long as the right-side structure and the left-side structure are not 50% each. That is, one side of the optically active materials exists more than half of the total amount. An example of a preferable "chiral" state is the state in which it is measurable by instruments such as a polarimeter and a circular dichroism (CD) spectrometer, that the material is not optically inactive. An example of a more preferable "chiral" state is that one of the optically active materials is 60% or more of the total amount, further preferably 65% or more, and as the case may be, a state in which it exists 70% or more.

"Substantially an inorganic polymer" in the present invention means that a polymer is composed of an inorganic compound, wherein the polymer can not be avoided from containing carbon atoms in side-chains of the polymer such as an alkyl group, a substituted alkyl group, an alkoxy group, and a substituted alkoxy group. However, carbon atoms are not included in the skeletal part of the polymer. Although such inorganic polymer is not especially limited as long as it is composed of metal atoms or non-metal atoms which do not include a carbon atom in the skeletal part, examples of preferred inorganic polymers are polymers of a silicon-containing compound such as silica having —Si—O— as a repeating unit and varieties of silicate in which elements such as aluminum, boron, gallium, germanium, tin, titanium, zirconium, and vanadium are added to the silica.

An example of "a chiral surfactant" in the process for producing an inorganic mesoporous material having a chiral twisted structure of the present invention is a surfactant having chirality and composed of a molecule having a charge. Examples of the surfactant in the present invention are preferably a chiral cationic surfactant and a chiral anionic surfactant and more preferably an anionic surfactant. However, the process of the present invention is not limited to using an anionic surfactant, and by selecting a monomer having an anionic functional group as the inorganic monomer, a cationic surfactant can be used in the same manner as the anionic surfactant.

Such anionic surfactant is not especially limited as long as it has a functional group which is capable of having a negative charge, such as a carboxyl group and a sulfonic acid group, and chirality exists in the molecule. However, an N-higher alkanoyl-amino acid salt is preferable because it is easy to be produced. An N-higher alkanoyl-amino acid salt can be produced simply by N-acylating an optically active amino acid with higher fatty acid. Chirality exists in an amino acid itself, and by introducing a higher alkyl group to the amino acid and causing it to have a hydrophobicity, a chiral anionic surfactant can be produced. Although the higher fatty acid used herein is not especially limited as long as the hydrophobicity can be given, an example of the higher fatty acid include a fatty acid with about 10 to 25 carbon atoms for the reasons of availability, and more preferably, an example is a fatty acid with about 10 to 20 carbon atoms such as oleic acid, myristic acid, and stearic acid. By making the N-higher alkanoyl-amino acid produced in such a manner into a salt by using an alkali metal such as sodium and potassium, the chiral anionic surfactant in the present invention is produced. Examples of N-higher alkanoyl-optically active amino acid sodium salt in the chiral anionic surfactant include N-myristoyl-L-alanine sodium salt, N-lauryl-L-alanine sodium salt, N-stearyl-L-alanine sodium salt, N-myristoyl-D-alanine sodium salt, N-lauryl-D-alanine sodium salt, N-stearyl-D-alanine sodium salt, N-myristoyl-L-sodium glutamate salt, N-lauryl-L-sodium glutamate salt, N-stearyl-L-sodium glutamate salt, N-myristoyl-D-sodium glutamate salt, N-lauryl-D-sodium glutamate salt, and N-stearyl-D-sodium glutamate salt.

The self-assembly of the chiral surfactant in the process of the present invention is produced by dissolving the above-described chiral surfactant into a solvent, followed by stirring, and then allowing to stand. Although depending on the kind of anionic surfactant, the treatment temperature is normally 5 to 50° C., preferably about 10 to 30° C., and normally it is possible to perform the treatment at room temperature. The solvent as such is preferably water and the like because of handiness, but it may also be a mixed solvent of water and an organic solvent having compatibility with water. Although examples of such organic solvent include methanol, ethanol, acetone, DMF, and DMSO, a solvent with volatility is preferable because of its ease in removing the solvent. Because the process in the present invention is based on the ion arrangement, the water used is preferably deionized.

In order to form the self-assembly of the chiral surfactant in the process of the present invention more easily, an adjuvant can be added and used. Examples of an adjuvant as such includes a higher alcohol having appropriate hydrophobicity and an free form of the anionic surfactant used, that is, the N-higher alkanoyl-amino acid. The free form of the anionic surfactant used may be added separately and used, or also be produced in solution by adding acid into the solution of the chiral anionic surfactant and neutralizing a part of the solution. Preferable example of such acid includes an inorganic acid such as hydrochloric acid, sulfuric acid, and phosphoric acid, although it is not limited to these. An example of preferable acid is hydrochloric acid. The amount of the acid added is 0.05 to 0.5 in molar ratio to the chiral anionic surfactant, preferably 0.1 to 0.5, and more preferably about 0.1 to 0.2.

"Polymerizable inorganic monomers" in the process of the present invention are not especially limited as long as the above-described "substantially inorganic polymer" can be formed. Examples include alkoxysilane and alkoxy metal silicate composed of a straight chain or branched alkoxy group having 1 to 10 carbon atoms, preferably 1 to 4 carbon atoms. In the case that these "polymerizable inorganic monomers" themselves have a positive charge, "polymerizable inorganic monomers" can be used independently. However, in the case that these "polymerizable inorganic monomers" themselves do not have a positive charge, it is necessary to introduce a functional group which can have a positive charge for a interaction with an anionic part of the above-described anionic surfactant. Examples of such functional group include an amino group and a substituted amino group, although it is not limited thereto. An example of a substituted amino group is a substituted amino group in which one or more hydrogen atoms in the amino group is substituted with a straight-chain or branched alkyl group having 1 to 10 carbon atoms, preferably 1 to 4 carbon atoms. And preferred examples of the substituted amino group include a trimethyl ammonium group and a triethyl ammonium group.

A normal synthesizing process can be used as a process to introduce "a functional group which can have a positive charge" to the inorganic monomer. Further, although the functional group may be introduced directly to an inorganic part of the inorganic monomer, it is more preferable to be introduced through a linker group such as a straight chain or branched alkyl group having carbon atoms of 1 to 10, preferably carbon atoms of 1 to 4. In the case of silane, it is preferably introduced as a group such as a trimethylaminoethyl group, a trimethylaminopropyl group, and a trimethylaminobutyl group. It is not preferable that the alkylene which becomes a linker group is too long, since the interaction between the inorganic polymer to be produced and the anionic surfactant becomes weak.

In the case that "polymerizable inorganic monomers" themselves do not have a positive charge, it is preferable to use "polymerizable inorganic monomers" and "polymerizable inorganic monomers having a functional group capable of having a charge" by mixture. The mixture ratio is not especially limited, however, since the latter takes a part not only in the formation of the inorganic polymer but also in the interaction with the anionic surfactant, the mixture ratio is 1:0.5 to 10 by molar ratio and more preferably about 1:0.5 to 5.

With regard to the polymerization process of the present invention, polymerization process depending on the kinds of inorganic monomer is adopted, however, a polymerization process that requires intensive stirring is not preferable because polymerization is performed using the self-assembly of a chiral surfactant as a template in the process of the present invention. A process in which the inorganic monomer can be polymerized in a stationary state as much as possible is preferable. For such a polymerization, alkoxysilane is preferable.

By polymerizing the inorganic monomer while keeping the interaction with the anionic surfactant using the self-assembly of a chiral surfactant as a template, an inorganic polymer corresponding to the template can be produced.

The inorganic polymer produced in such a manner includes the anionic surfactant used as a template even after the solvent is separated. Because chirality exists in the inorganic polymer as it is, it can be used as the chiral inorganic mesoporous material in the present invention. However, as occasion demands, the self-assembly of the chiral surfactant used as a template can be removed. Examples of the process for removing the self-assembly of the chiral surfactant used as a template are various kinds of processes including a process for draining the anionic surfactant with a solvent such as water and a process for calcinating at high temperature. In the case of calcinating at high temperature, not only the anionic surfactant but also an organic group in "polymerizable inorganic monomers having a functional group capable of having a charge" is eliminated by the calcination.

Further, the present invention provides a chiral inorganic mesoporous material, having a chiral twisted structure and being mesoporous, which is composed of substantially inorganic polymer that is produced by the above-described process. Regardless of the producing processes, the chiral inorganic mesoporous material of the present invention is a material substantially composed of an inorganic polymer, which has a feature of "chiral" by having a chiral twisted structure, and mesoporous. The chiral inorganic mesoporous material of the present invention may be in the state where the chiral surfactant as a template is included or in the state where the chiral surfactant as a template is removed as long as it has the above-described characteristics.

Because the chiral inorganic mesoporous material in the present invention is produced using self-assembly of a chiral surfactant as a template, the structure depends on the structure of the self-assembly of an anionic surfactant to be used as a template. However, the structure is normally a unit of a hexagonal system, and it is considered that chirality is occurring because this hexagonal form is a twisted structure as shown in FIG. 3b. In the example described later, the diameter of the hexagon is 200 to 400 nm, the maximum length of the hexagonal column is about 6 μm, and the pitch of the twist is about 1.5 μm. This hexagonal column is observed as a twisted rod under an electron microscope. This hexagonal column is formed from spiral inorganic polymers. FIG. 3c shows a cross-section of this hexagonal column and each circle in the hexagon indicates an inorganic polymer. FIG. 3c shows that such a linear inorganic polymer exists in the twisted hexagonal column with a spiral form. Forming a rod-like aggregate as a bundle of the twisted linear polymers which has become a spiral form is one of the characteristics of the chiral inorganic mesoporous material of the present invention. It is considered that a mesoporous structure is occurring among these linear inorganic polymers.

The inorganic mesoporous material having chirality in the present invention can be used in a variety of chemical reactions and chemical processes (for example, a separation process and a concentration process). When a chiral raw material or a chiral product relates to these chemical reactions or processes, the inorganic mesoporous material having chirality of the present invention is especially effective because it reacts uniquely with a specific chirality. The first application process is a process for synthesizing a chiral material from a chiral raw material, a non-chiral raw material, or a racemic raw material by performing a chemical reaction inside the pores of the chiral inorganic mesoporous material. In this process, the reaction can be performed in a liquid phase, a gas phase, or a supercritical fluid. A reaction bed such as a fixed bed or a fluidized bed used in a normal process in the chemical industry can be adopted. The second application process is a process for concentrating or separating a specific chiral material from a chiral material or a racemic material using the chiral inorganic mesoporous material in the present invention. In this case, the concentration or the separation can be also performed in a liquid phase, a gas phase, or a supercritical fluid. In the concentration or the separation, a cylindrical column is filled with the material in the present invention and a fluid of raw material is flowed into the column at appropriate rate. The process in the present invention is especially effective for the separation of a racemate.

Further, the present invention provides a process for producing a chiral inorganic mesoporous material complex containing the metallic nano-wire, including chemically and physically fixing a metal to the surface of the pore of the above-described chiral inorganic mesoporous material in the present invention and a process of manufacturing a metallic nano-wire including removing the inorganic mesoporous material from the complex.

A process for chemically and physically fixing a metal to the surface of the pore of the chiral inorganic mesoporous material in the process of the present invention is not especially limited as long as a metal or a metal atom is taken into the pore and the state in which the pore and the metal are mutually fixed can be formed. Specifically, an example of the process is a process for treating the chiral inorganic mesoporous material in the present invention with a water-soluble metal salt, more specifically, a process for impregnating the material into the solution containing a metal salt and a treatment of vapor-depositing a metal into the pore, further specifically, a process for vapor-depositing by chemical vapor deposition and the like.

By treating the chiral inorganic mesoporous material complex containing the metallic nano-wire obtained in such manner with acid such as sulfuric acid and hydrogen fluoride acid and removing the inorganic mesoporous material, a metallic nano-wire is manufactured. The metallic nano-wire manufactured with the process of the present invention has a twisted structure similar to that of the inorganic mesoporous material in the present invention, and the possibility of making the metallic nano-wire have elasticity like a spring depending on the pitch of the helix.

In order to explain the present invention further in more detail, the present invention is explained more specifically by presenting an example which silane is used as the inorganic monomer, N-myristoyl-L-alanine sodium salt ($C_{14}$-L-AlaS) is used as the anionic surfactant, and a mixture of tetraethoxysilane (TEOS) as the polymerizable inorganic monomer and N-trimethoxysilylpropyl-N,N, N-trimethylammonium chloride (TMAPS) as the polymerizable inorganic monomer having a functional group, however, the present invention is not limited to these examples.

The inventors of the present invention dissolved N-myristoyl-L-alanine sodium salt into water, added a small amount of HCl into the solution, and prepared a partly neutralized solution of N-myristoyl-L-alanine sodium salt. By adding a methanol solution of a mixture of tetraethoxysilane (TEOS) as the polymerizable inorganic monomer and N-trimethoxysilylpropyl-N,N, N-trimethylammonium chloride (TMAPS) as the polymerizable inorganic monomer having a functional group capable of having a charge to the solution and polymerizing them, a chiral and meso-structured product was obtained. The molar ratio of the reaction mixture was $C_{14}$-L-AlaS:HCl:TMAPS:TEOS:$H_2O$=1:0.1:6:7:1722.

X-ray diffraction (XRD) was performed on a silica that was obtained by calcinating a polysilane containing the obtained partly neutralized solution of N-myristoyl-L-alanine sodium salt. The result of the x-ray diffraction (XRD) at the 2θ range of 1.5 to 6° is shown in FIG. 1. The vertical axis in FIG. 1 shows intensity and the horizontal axis shows 2θ/°. As a result, three peaks, which are indicated as 10, 11, and 20 in FIG. 1, were observed in the calcinated silica having a chiral and meso structure of the present invention in the 2θ range of 1.5 to 6°, d at 2θ=2.3 was 3.8 nm, d at 2θ=4.0 was 2.2 nm, and d at 2θ=4.6 was 1.9 nm. From these, the calcinated silica having a chiral and meso structure obtained in the present invention is shown to be a 2d—hexagonal system composed of a p6mm unit cell of $a=nm(2d_{100}/\sqrt{3})$.

Then, the calcinated silica having a chiral and meso structure obtained in the present invention was observed with a scanning electron microscope (SEM). The result is shown by a photograph taking the place of a drawing in FIG. 2. FIG. 2a is the photo from the observation with a scanning electron microscope (SEM). One division of the scale at the lower part of the photo indicates 1 μm. From this photo, it is found that the silica has a twisted structure. It is also found that a right twist and a left twist are existing in the twisted structure. Further, a cross-section of the twisted rod-like material is a hexagon and a twisted groove along the axis of the rod can be observed on the six surfaces. The image of the scanning electron microscope (SEM) showed that the material is a twisted rod-like hexagonal system, the diameter is 200 to 400 nm, the maximum length is about 6 μm, and the pitch of the twist is about 1.5 μm.

FIGS. 2b to 2d show a structure of the material schematically, which was presumed on the basis of the observations with the x-ray diffraction and the SEM. According to the observations with the x-ray diffraction and the SEM, it is found that a cross-section of the rod-like material observed with the SEM forms a hexagonal and cylindrical material in which long fiber-formed inorganic polymers are tied up in bundles, and that the bundles of the fibers in the hexagon have a twisted structure to the right or to the left. FIG. 2b shows such a structure of the inorganic polymer having a chiral meso structure in the present invention. A structure twisted to one side (to the right) is shown in FIG. 2b. It is considered that the chirality is occurring due to the twist. FIG. 2c shows a cross-section at the end of such twisted hexagonal column schematically. In the cross-section, a groove composed of many long fiber-formed inorganic polymers (shown as a circle in FIG. 2c) is arranged in line. FIG. 3d shows a twist of one groove existing in the rod-like material (a hexagonal column composed of bundles of the long fiber-formed inorganic polymers) schematically and shows the condition that a 2d chiral groove is formed. It is presumed that the hexagonal column becomes twisted as a whole due to the twist of each groove.

Next, the mesoporous structure of the chiral material was analyzed using a tunneling electron microscope (TEM). It is difficult to understand three-dimensional information directly from the two-dimensional image (2d) obtained from a scanning electron microscope (SEM). Therefore by three-dimensionalizing a measurement result from the TEM using a computer simulation, it becomes possible to determine the structure of the material in detail. The result is shown in a photo taking the place of a drawing in FIG. 3. FIGS. 3a to 3c show images of the rod-like material by the tunneling electron microscope (TEM) and each photo was taken with increasing magnification in the order of the figures. Each bar in FIGS. 3a to 3c indicates 100 nm, 50 nm, and 20 nm respectively. FIG. 3d is an image produced by a simulation based on these results. The arrows in the FIG. 3 indicate a fringe (10) of the twisted rod-like material and the arrow-heads indicate a fringe (11).

The result of the simulation is fairly identical to the observed TEM image. The contrast of the dark diamond shapes in the simulation image in FIG. 3d is considered to be the projection of a <01> edge which is a thickness effect due to the rod-like material being a hexagonal column. However, such contrast observed in the actual TEM image was very weak. Although it is difficult to observe whether the groove in the rod-like material is chiral or not directly from the TEM image, such 2d-hexagonal chiral groove existing in the rod-like material is produced by the simulation of the projected image.

From the observed TEM image, two kinds of fringes indicated as an arrow and an arrow-head in FIG. 3 are found. Each kind of fringe corresponds to the surface separations of the (10) and the (11) respectively. When one of the <01> directions is parallel to the electron beam, the fringe with the surface separation of the (10) appears. The spacing between two (10) fringes where the rod is twisted at 60° expresses the distance between these fringes and they are ⅙ of one pitch (corresponding to a distance between two adjacent arrows in the TEM image). Further, the (11) fringe is located exactly in the middle of two of the (10) fringes.

Some of the (10) fringes which are longer and more twisted were observed. It is considered that these (10) fringes occurred because these rod-like materials are not located completely perpendicular to the electron beam. The changes in the (10) fringes in various positions in one rod-like material is because the rod-like material is not completely straight.

Then, a more detailed TEM image was observed. The result is shown in a photo taking the place of a drawing in FIG. 4. FIG. 4b shows an image of the rod-like material by the tunneling electron microscope (TEM). The bar indicates 50 nm. FIG. 4c shows the image produced by a simulation when the rod-like material is assumed to be tilted at 15°. FIG. 4a schematically shows the irradiation of the electron beam to an inclination of the rod-like material. The simulation image shown in FIG. 4c is also completely identical to the observed TEM image. In this image, all of the (10) fringes curve severely and the way they curve is the same inside the rod. When these rod-like materials are tilted relatively to the same direction to the electron beam, the directions to which the (10) fringes curve in a right-handed chiral and in a left-handed chiral are opposite to each other.

From the direction to which the (10) fringes curve, it can be known whether the rod-like material is a right-handed chiral or a left-handed chiral. The rod-like material observed in the TEM image is a left-handed chiral.

Further, the mesoporous silica has a straight or periodically twisted higher hexagonal structure.

Next, a desorption and absorption curve by nitrogen was obtained in order to measure the gap of such inorganic polymer in the present invention. The result is shown in FIG. 5. The vertical axis of the graph in FIG. 5 indicates volume (cm$^3$g$^{-1}$STP) and the horizontal axis indicates relative pressure (P/P$_0$). The horizontal axis of the BJH pore size graph indicates pore in diameter (nm). As a result, it was found that the inorganic polymer has a mesoporous and unified structure having a BJH (Barrett-Joyner-Halenda) pore of 2.2 nm in diameter. Further, the BET (Brunauer-Emmett-Teller) surface area was 600 m$^2$g$^{-1}$ and the volume of the mesopore was 370 mm$^3$g$^{-1}$ (refer to FIG. 5).

Furthermore, a CD (circular dichroism) of the synthesized gel was measured in order to measure the optical purity of the material. The molar ratio of the reaction mixture of the gel was C$_{14}$-L-AlaS:HCl:TMAPS:TEOS:H$_2$O=1:0.1:6:7:1722, the measurement condition was at 22° C. in a cell of 1 cm cell-length, and a spectropolarimeter (JASCO J-710) was used. The chart of the measured CD is shown in FIG. 6.

As a result, a positive-signed CD band of 210 to 250 nm which is a typical CD spectrum by a chiral micelle similar to acylglutamate was shown (refer to FIG. 6). A micelle by acylglutamate has been already reported to be systematically self-assembled and optically pure.

On the other hand, a gel synthesized from a racemate did not show a CD band (the data is not shown here). The inventors of the present invention synthesized the chiral mesoporous materials having the ratio of a left-handed chiral to a right-handed chiral of 6.5/3.5 and 7.5/2.5 from C$_{14}$-L-AlaS/TMAPS and C$_{14}$-L-AlaS/APS respectively. The result shows that a competitive primary factor to form a chiral structure besides packing of the chiral surfactant exists. For comparison, a similar synthesis using N-acyl-DL-alanine sodium salt of a racemate was performed and a very small amount of a twisted material was obtained. However, the mesoporous silica of 2d-hexagonal was unstable (collapsed by calcination).

An approach of the inventors of the present invention toward the synthesis of a chiral mesoporous silica is considered to be based on the interaction of N-acyl-L-alanine sodium salt as a chiral nonionic surfactant and a small amount of free N-acyl-L-alanine, with the quaternary ammonium silane or aminosilane as a CSDA in a micelle head. The present inventors proved that a chiral meso-structured inorganic polymer is formed using a partly neutralized N-myristoyl-L-alanine sodium salt (C$_{14}$-L-AlaS) by HCl, N-trimethoxysilylpropyl-N,N,N-trimethylammonium chloride (hereinafter, cationic part thereof is referred to as TMAPS), and 3-aminopropyltrimethoxysilane (APS).

Then, the present inventors deduced the mechanism of producing such chiral meso-strucutred inorganic polymer. FIG. 7 shows this mechanism schematically. FIG. 7 schematically shows a template of the self-assembly of the chiral surfactant in the present invention and the arrangement of the inorganic polymer. It shows the interactions of the head group of the functional group of a negatively charged of the anionic surfactant (—COO$^-$) and its free form (—COOH), with a positively charged quaternary ammonium silane TMAPS (FIG. 7a) and with aminosilane APS (FIG. 7b).

As shown in FIG. 7, the chiral surfactant forms a self-assembly of the chiral surfactant by centralizing its hydrophobic region, putting outward a hydrophilic group, and self-assembling helical. An free form (—COOH) partly existing in the self-assembly reacts as a cosurfactant such as decanol in a chiral liquid crystal system, which induces a structural change by an amphiphilic material in the micelle, thereby twisting the form of the micelle into a chiral micelle structure. Then, the outer hydrophilic region are assembled systematically to form a cholesteric phase and a self-assembly of the chiral surfactant.

Around the outside of the self-assembly of the chiral surfactant formed in such a manner, the ammonium sites having TMAPS which has a counter ion (in the case of an anionic surfactant, a counter ion is a cation because the hydrophilic group is an anion) or having a positive charge of APS are fixed. Then, by leading to the polymerization reaction of the inorganic monomer based on the electrostatically fixed TMAPS or APS in such manner (for example, tetraethoxysilane (TEOS)), the inorganic polymer shown in FIG. 7 is formed. The inorganic polymer formed in such a manner is reflecting a helix structure of the self-assembly of the chiral surfactant as it is and becomes an inorganic polymer in which the self-assembly of the chiral surfactant was used as a template.

Subsequently, by removing the self-assembly of the chiral surfactant used as a template if necessary by washing or calcinating, only the inorganic polymer having a chiral meso structure remains. If the calcination temperature is increased, the organic part suspending in the inorganic polymer (an alkylammonium part) can also be removed.

In such a mechanism, it is important to form a template and to prepare an inorganic monomer having a group which can be fixed electrostatically along the template. Further, it is possible to adjust the size of the mesoporous structure by properly selecting the kinds of the chiral surfactant to be used, the process for forming the self-assembly of the chiral surfactant, the process of removing the same, and the kinds of remaining groups suspending to the skeleton of the inorganic polymer.

That is, the present invention clarifies that a template having a chiral twist can be formed by forming a template having a helical twist by the self-assembly of the chiral surfactant and that the inorganic polymer having a chiral mesoporous structure, which has been conventionally considered impossible to produce, can be produced by arranging an inorganic monomer having a group which can be fixed electrostatically along the template and polymerizing the inorganic monomer.

The inorganic mesoporous material having a chiral twisted structure in the present invention can selectively take various kinds of molecules into the pore region by using the mesoporous characteristic. Further, because it has chirality, it becomes possible to produce or separate selectively one of the optically active materials. For example, use for the separation of a racemate or to use as a reaction field of an asymmetric synthesis would become possible. Further, the inorganic mesoporous material having a chiral twisted structure in the present invention can be used as a template for manufacturing when a chiral metallic nano-wire. Furthermore, by changing the degree of the twist, which is the length of the pitch in such nano-wire, it becomes possible to manufacture a nano-spring comprised of the metallic nano-wire.

For example, a nano-wire was manufactured by inserting Co or Pt into a chiral groove of the inorganic mesoporous material having a chiral twisted structure of the present invention. The TEM image of the nano-wire manufactured in such a manner is shown in a photo taking the place of a drawing in FIG. 8. FIG. 8a and FIG. 8b are the TEM images showing a Co nano-wire (FIG. 8a) and a Pt nano-wire (FIG. 8b) each inserted in a different chiral rod-like material (wires are shown dark in the TEM image). In the Co wire, some of the Co overflows to the outside of the surface of the rod-like material (FIG. 8a). FIG. 8c shows a different groove schematically. When the wire is inserted into a different groove, the curvature of the wire becomes different because each groove curves helically. From the contrast of the Co wire shown as an arrow and an arrow-head in FIG. 8a, the way that the Co wire is twisted is found to be different. This also proves that these grooves have chirality. Although it is not clear in the projected image, many of the Pt wires were inserted into the grooves.

The present inventors showed for the first time in the world that a high quality chiral mesoporous structure can be obtained using a chiral surfactant capable of forming a self-assembly of a chiral surfactant. The formation of the chiral mesoporous structure in the present invention depends largely on the formation of a self-assembly of the chiral surfactant as a template, and the orientation of the head part of the micelle of the chiral surfactant like this is controlled thermodynamically. However, depending on the case, it is possible for the orientation to be controlled kinetically, not only thermodynamically. When the formation of the self-assembly of the chiral surfactant is controlled kinetically, it becomes necessary, depending on the kinds of the surfactant to be used, to polymerize in a timely manner the inorganic polymer when the self-assembly of the chiral surfactant is formed because the formed micelle does not always exists stably.

Effect of the Invention

The present invention provides an inorganic mesoporous material having a chiral twisted structure and a process for producing the same for the first time. Because the inorganic mesoporous material having a chiral twisted structure in the present invention has chirality and a mesoporous structure, it has not only the characteristics of a conventional mesoporous material, but also the selectivity due to the chirality at the same time. It has the wide range of use not only as an optically active material, but also for the separation of a racemate and as a reaction field of an asymmetric synthesis. Further, since the inorganic mesoporous material having a chiral twisted structure has a nano-scaled groove and the twist is chiral, it is very useful as a material and a template in nano-technology such as a chiral nano-wire.

BRIEF DESCRIPTION OF THE DRAWINGS

FIG. 2c shows that a large number of the grooves (circles) exist in the rod-like material.

FIG. 3 shows an image of the rod-like material composed of the inorganic polymer in the present invention by a tunneling electron microscope (TEM) and the result of the analysis in a photo taking the place of a drawing.

FIG. 4 shows an image of the rod-like material composed of the inorganic polymer in the present invention by a tunneling electron microscope (TEM) and a result of the analysis in a photo taking the place of a drawing.

FIG. 7 shows the interactions of the end of the functional group of a negatively charged anionic surfactant (—COO⁻) and its free form (—COOH) with a positively charged quaternary ammonium-silane TMAPS (FIG. 7a) and with aminosilane APS (FIG. 7b).

FIG. 8 shows a tunneling electron microscope (TEM) image of the nano-wire manufactured by inserting Co or Pt in the chiral mesoporous silica in the present invention in a photo taking the place of a drawing.

BEST MODE FOR CARRYING OUT THE INVENTION

Hereinafter, the present invention will be more specifically explained by examples, however, the present invention is not limited thereto.

EXAMPLE 1

Production of Chiral Mesoporous Silica

N-myristoyl-L-alanine sodium salt (0.32 g, 1 mmol) was dissolved in 32 g of deionized water and stirred at room temperature. 0.1M of HCl (1.4 g, 0.14 mmol) was added to the solution and stirred intensively at room temperature. After stirring for an hour, 50% methanol solution of a mixture of 1.40 g of tetraethoxysilane (TEOS) and 0.20 g of N-trimethoxysilylpropyl-N,N, N-trimethylammonium chloride (TMAPS) was added and stirred at 22° C. Then, the mixture was left alone for 2 hours at 22° C.

Further, the mixture was kept at 80° C. for 15 hours to give a chiral meso-structured product was obtained. This product was centrifuged, dried at 60° C., and a chiral mesoporous silica was obtained.

Figure 6:
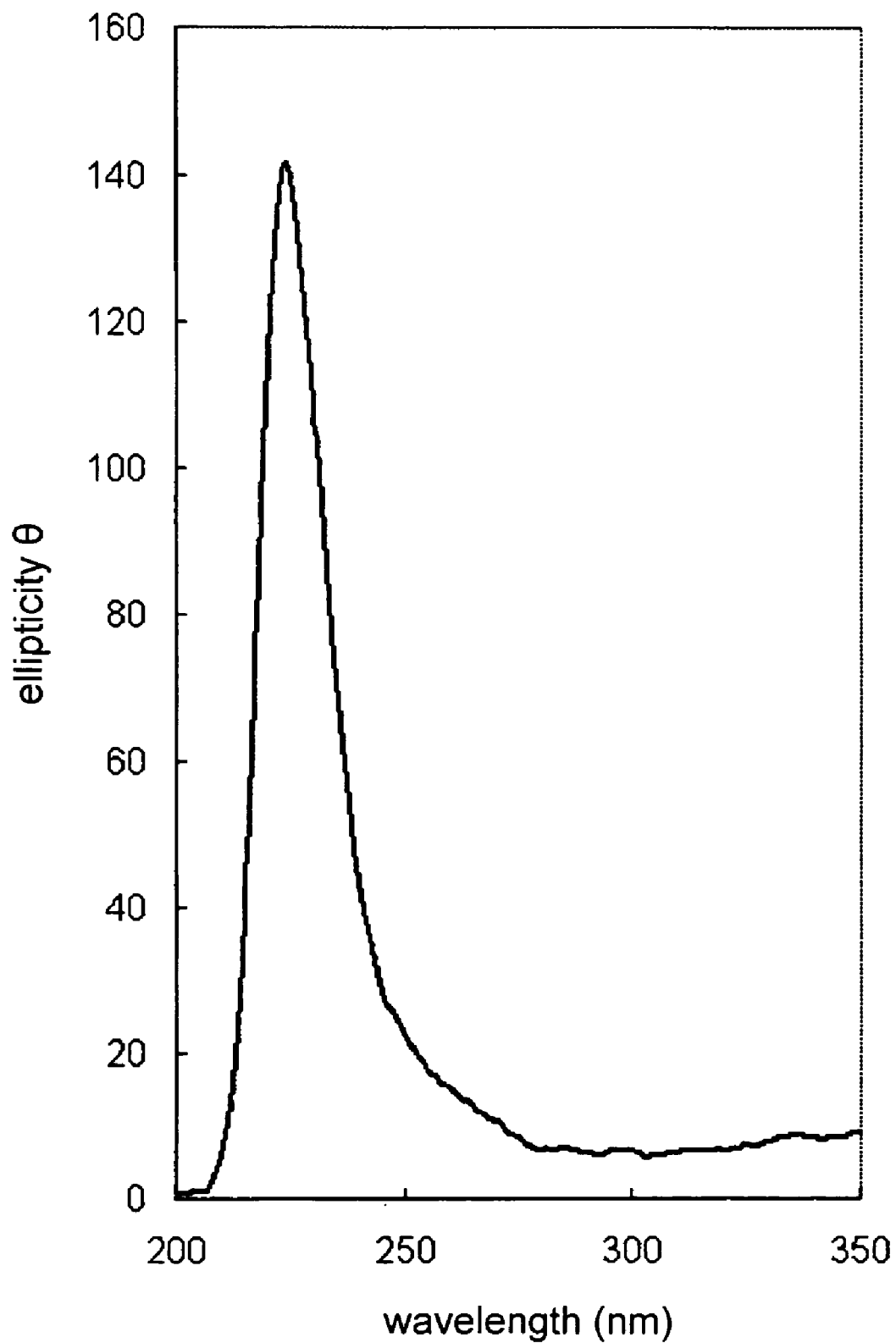
FIG. 6 shows a CD spectrum of the gel of the chiral mesoporous silica in the present invention.
Figure 7A:
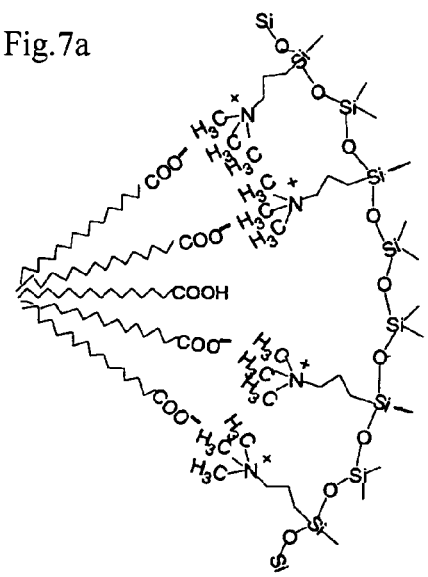
FIG. 7 schematically shows a template of the self-assembly of the chiral surfactant in the present invention and the arrangement of the inorganic polymer.
Figure 7B:
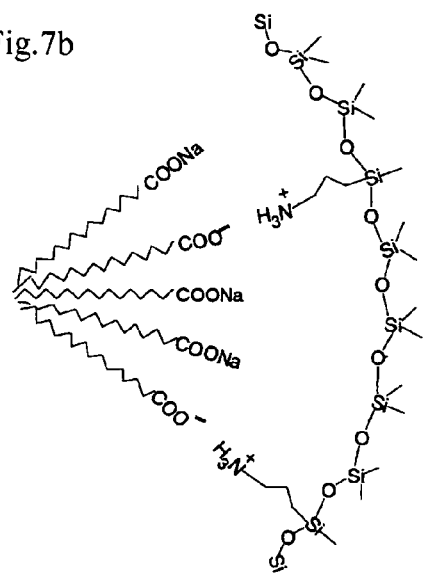

The CD (circular dichroism) of the obtained gel was measured at 22° C. in a cell of 1 cm cell-length using a spectropolarimeter (JASCO J-710). The chart of the measured CD is shown in FIG. 6.

EXAMPLE 2

Production of Calcinated Chiral Mesoporous Silica

By calcinating the product obtained in Example 1 at 650° C. for 6 hours, a surfactant of a template and the organic part of silane were removed to give a chiral mesoporous silica.

Figure 1:
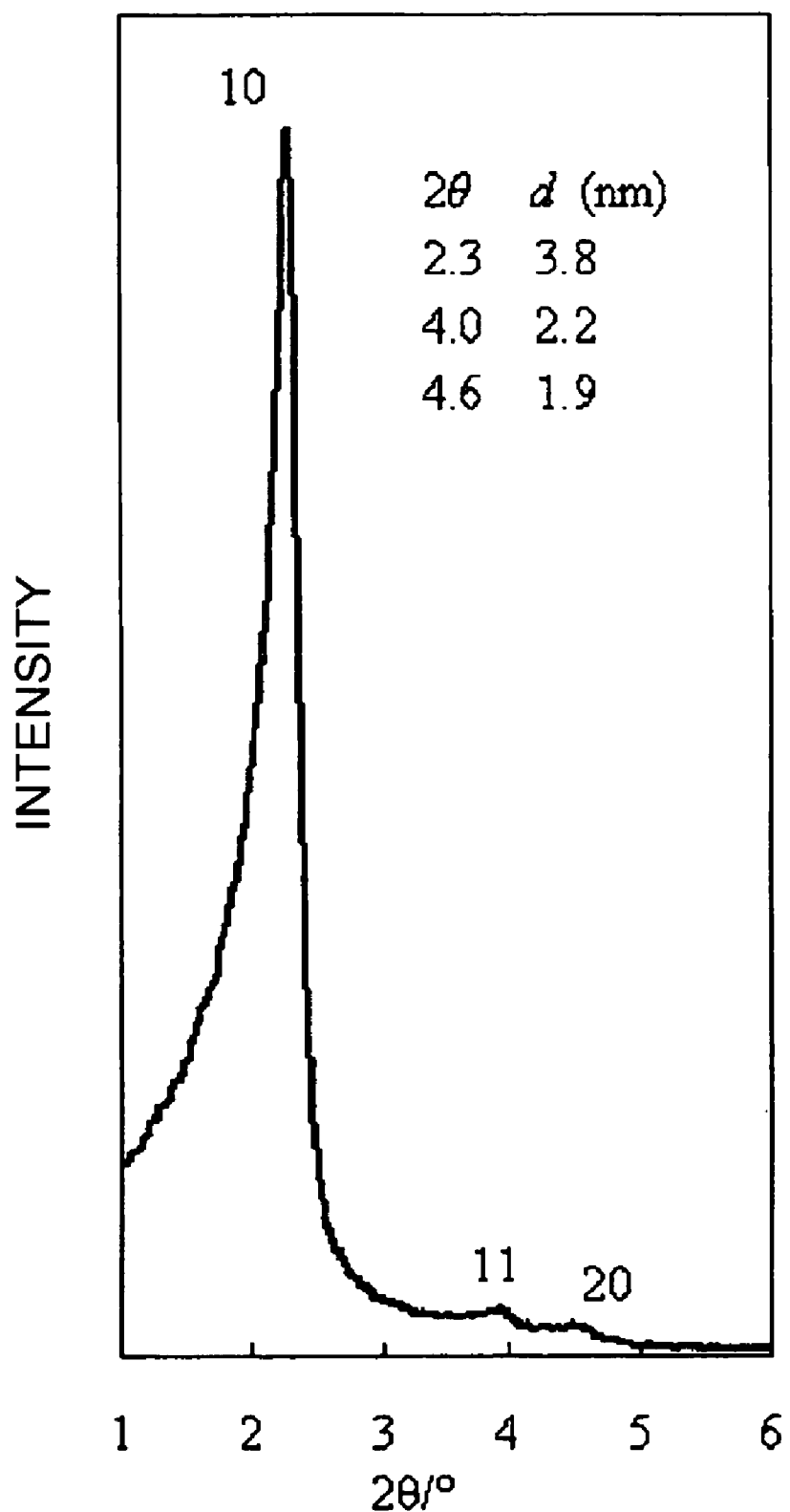
FIG. 1 shows the x-ray diffraction (XRD) of the chiral mesoporous silica obtained by the process of the present invention.
Figure 2A:
FIG. 2a shows a scanning electron microscope (SEM) image of the calcinated chiral mesoporous silica in a photo taking the place of a drawing.
Figure 2B:
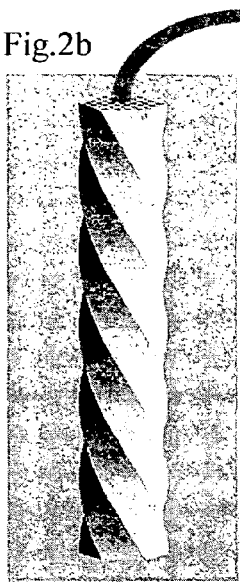
FIG. 2b shows the rod-like material observed with SEM schematically.
Figure 2C:
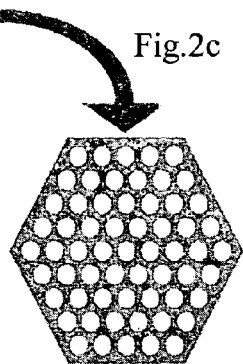
FIG. 2c shows its cross-section schematically.
Figure 2D:
FIG. 2d shows a twist of these grooves schematically.
Figure 3A:
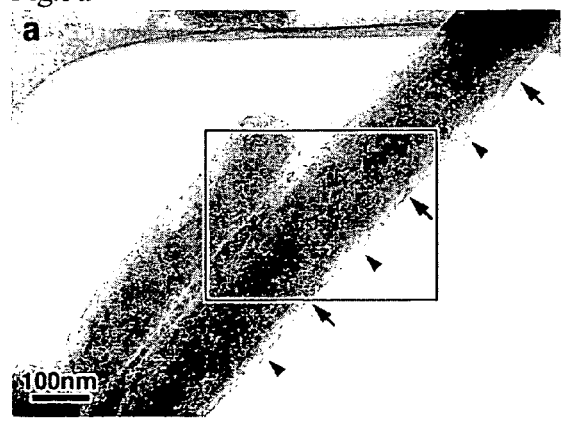
FIGS. 3a to 3c show images of the rod-like material by a tunneling electron microscope (TEM), and each photo was taken with increasing magnification in the order of the figures. Each bar in FIGS. 3a to 3c indicates 100 nm, 50 nm, and 20 nm respectively.
Figure 3B:
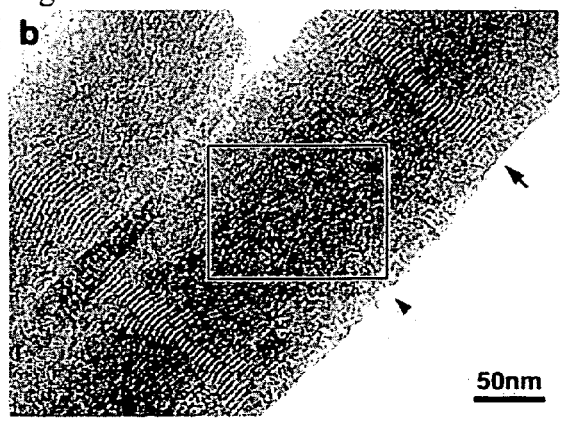
Figure 3C:
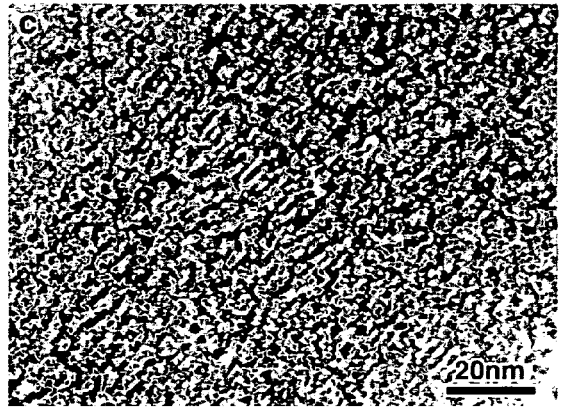
Figure 3D:
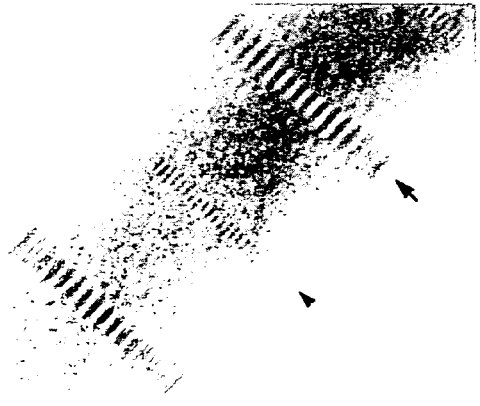
FIG. 3d is an image produced by a simulation based on these results. The arrows in FIG. 3 indicate a fringe (10) of the twisted rod-like material and the arrow-heads indicate a fringe (11).
Figure 4A:
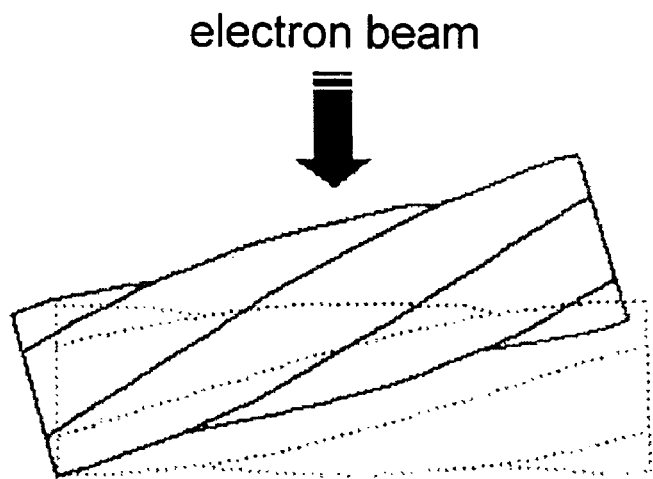
FIG. 4a schematically shows the irradiation of the electron beam to an inclination of the rod-like material.
Figure 4B:
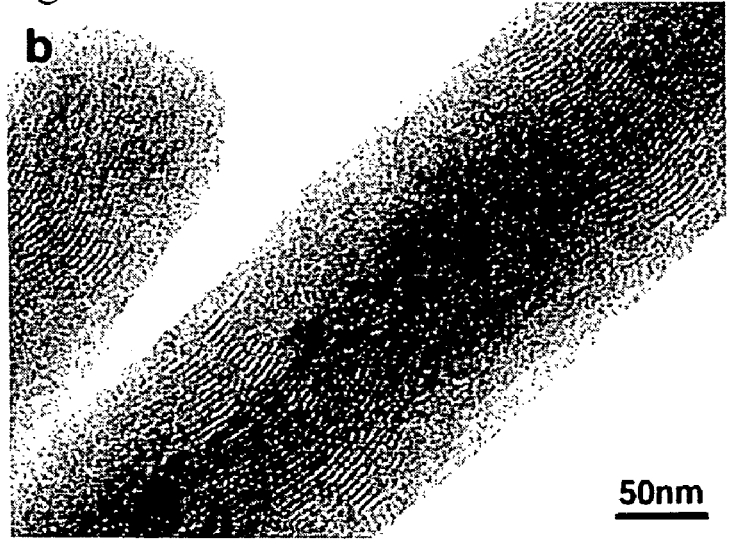
FIG. 4b shows an image of the rod-like material by a tunneling electron microscope (TEM). The bar indicates 50 nm.
Figure 4C:
FIG. 4c shows the image produced by a simulation in which the rod-like material is assumed to be tilted at 15°.
Figure 5:
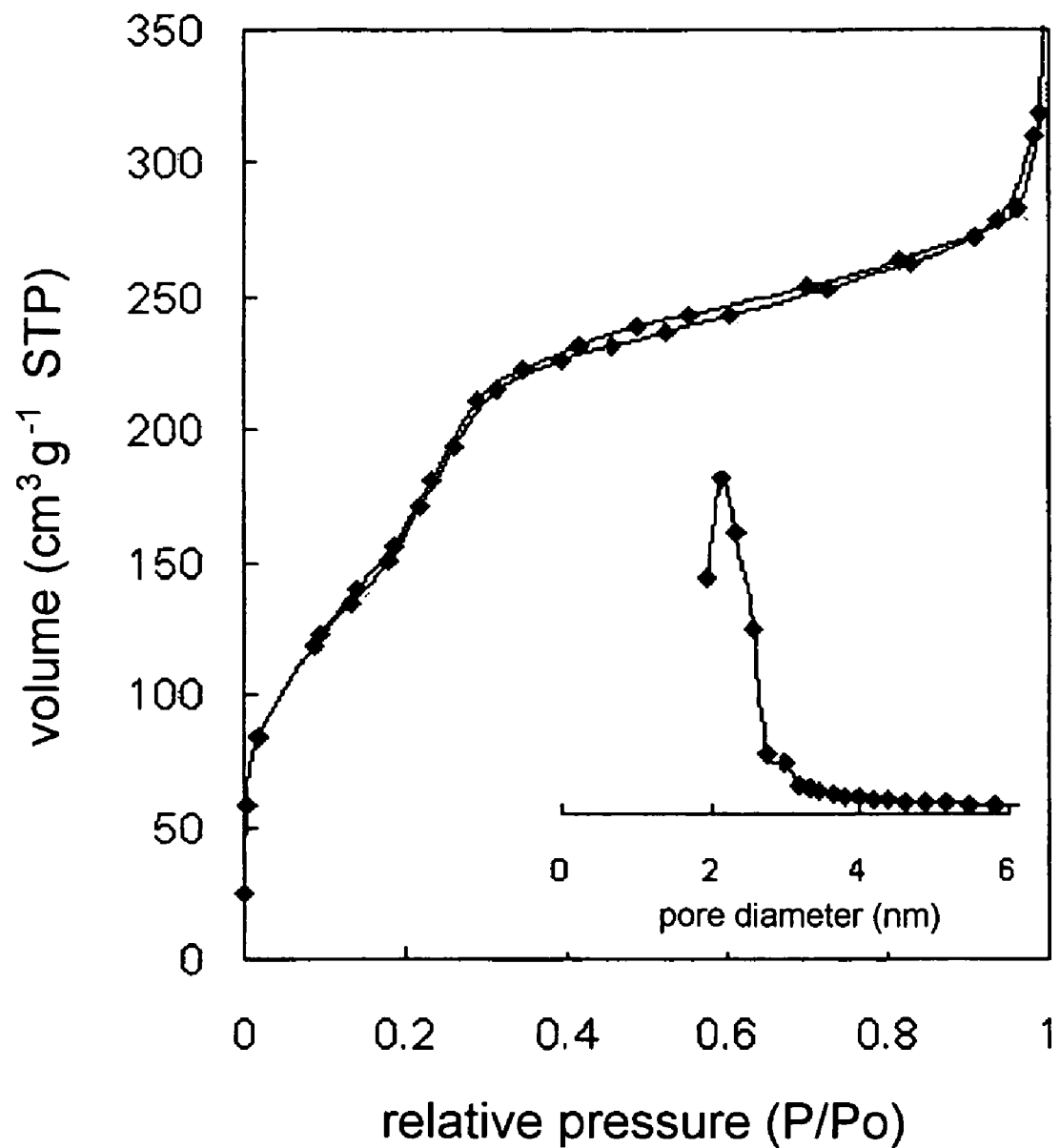
FIG. 5 shows a desorption and absorption curve by nitrogen gas and a result of the measurement of the pore diameter of the chiral mesoporous silica in the present invention. The vertical axis of the graph in FIG. 5 indicates volume ($cm^3 g^{-1}$ STP) and the horizontal axis indicates relative pressure ($P/P_0$). The horizontal axis of the BJH pore size graph indicates pore diameter (nm).

The x-ray diffraction of the obtained chiral mesoporous silica is shown in FIG. 1, photos of the electron microscope are shown in FIGS. 2 to 4, and a desorption and absorption curve by nitrogen is shown in FIG. 5.

EXAMPLE 3

Production of Chiral Metal Oxide Nano-Wire

A chiral metallic nano-wire was manufactured by a two-step process using the chiral mesoporous silica as a template.

0.15 g of chiral mesoporous silica was impregnated to metal precursors ($Co(NO_3)_2 \cdot 6H_2O$ and $[Pt(NH_3)_4](NO_3)$) of 1.8 to 2.6 mmol in total. The Co and Pt precursors were activated by heating slowly up to 350° C. in an oxygen environment, and then each of the precursors were reduced in a hydrogen gas stream at 300° C. and 430° C. respectively.

Figure 8A:
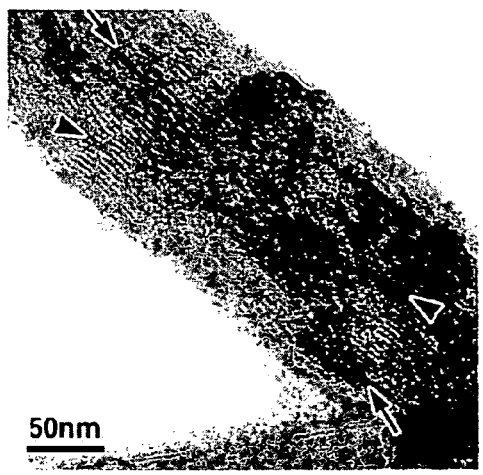
FIG. 8a shows the case of using Co as a metal and FIG. 8b shows the case of using Pt as a metal. Arrows and arrow-heads in FIGS. 8a and 8b show the twist of the metallic wire.
Figure 8B:
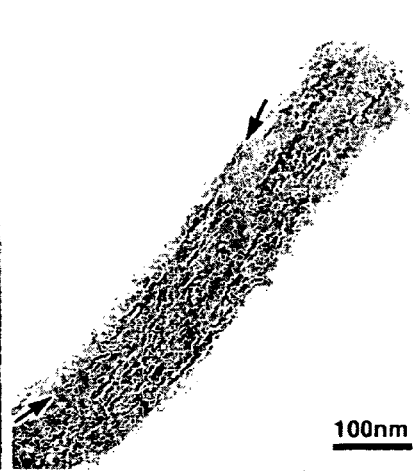
Figure 8C:
FIG. 8c shows the twist of the manufactured metallic wire schematically.

The electron microscope photos of the obtained metallic nano-wires are shown in FIG. 8a (in the case of Co) and FIG. 8b (in the case of Pt) respectively.

EXAMPLE 4

Production of Chiral Mesoporous Silica 0.4g of N-myristoyl-L-alanine sodium surfactant ($C_{14}$-L-AlaS) was dissolved in 42.7 g of water and 1.8 g of 0.1N hydrochloric acid, and uniformed at room temperature, then a mixture of 1.96 g of tetraethyl orthosilicate (TEOS) and 0.31 g of N-trimethoxysilylpropyl-N,N,N-trimethylammonium chloride (TMAPS) was added and stirred for 5 minutes. The stirring of the solution was stopped, and after maturing the solution by keeping still at 30° C. for 2 hours, the solution was kept still at 80° C. for 15 hours to give a white precipitate in the solution. This precipitate was filtered by suction filtration, dried at 100° C. overnight to give a chiral mesoporous silica complex. This mesoporous silica complex was calcinated at 600° C. for 6 hours to give the objective chiral mesoporous silica shell.

Figure 9:
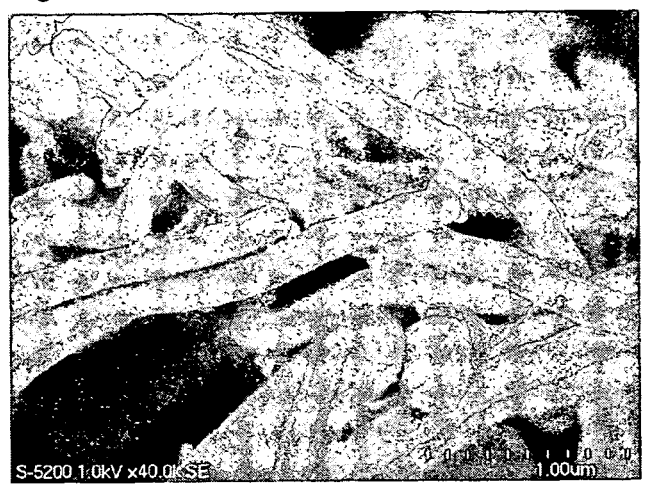
FIG. 9 is a photo of the chiral mesoporous silica in the present invention obtained in Example 4 by FE-SEM.

In each of the x-ray diffraction patterns of the obtained mesoporous silica complex and mesoporous silica shell, three diffraction peaks were observed in the 2θ range of 1 to 5 and they were indexed as 10, 11, and 20 of a 2d-hexagonal p6mm structure. In the mesoporous silica in Example 4, it was confirmed that a two-dimensional channel of a 2d-hexagonal p6mm structure was formed. As shown in FIG. 9, the mesoporous silica in Example 4 was observed with FE-SEM and rod-like particles were observed to have a twisted form. This suggests that the two-dimensional channel of the 2d-hexagonal p6mm structure is arranged helically along the outward appearance of the twist, and a chiral mesoporous silica was obtained. Particles were randomly selected and counted regarding the direction of the twist of this chiral mesoporous silica, and the ratio of the sinistrality to the dextrality was 65/35.

EXAMPLE 5

Production of Chiral Mesoporous Silica

Here is shown an example in which the maturing temperature of 30° C. was changed to 28° C. as a comparison to the above-described Example 4.

0.4 g of N-myristoyl-L-alanine sodium surfactant ($C_{14}$-L-AlaS) was dissolved in 42.7 g of water and 1.8 g of 0.1N hydrochloric acid, and uniformed at room temperature, then a mixture of 1.96 g of tetraethyl orthosilicate (TEOS) and 0.31 g of N-trimethoxysilylpropyl-N,N,N-trimethylammonium chloride (TMAPS) was added and stirred for 5 minutes. The stirring of the solution was stopped, and after maturing the solution by keeping still at 28° C. for 2 hours, the solution was kept still at 80° C. for 15 hours to give a white precipitate in the solution. This precipitate was filtered by suction filtration, dried at 100° C. overnight to give a chiral mesoporous silica complex. This mesoporous silica complex was calcinated at 600° C. for 6 hours to give the objective chiral mesoporous silica.

In the x-ray diffraction pattern of this mesoporous silica complex, two diffraction peaks were observed in the 2θ range of 1 to 5 and they were indexed as 10 and 11 of a 2d-hexagonal p6mm structure. In the obtained mesoporous silica complex, it was confirmed that a two-dimensional channel of a 2d-hexagonal p6mm structure was formed. In the case of a mesoporous silica shell, it was suggested that the periodic regularity is high. However, the high-order diffraction lines which identify a meso structure are not clear, and it is considered to be a structure in which channels of mesopore are arranged in a disorderly manner. From this, it is considered that a 2d-hexagonal p6mm structure and a structure in which channels of mesopore are arranged in a disorderly manner are existing together.

Figure 10:
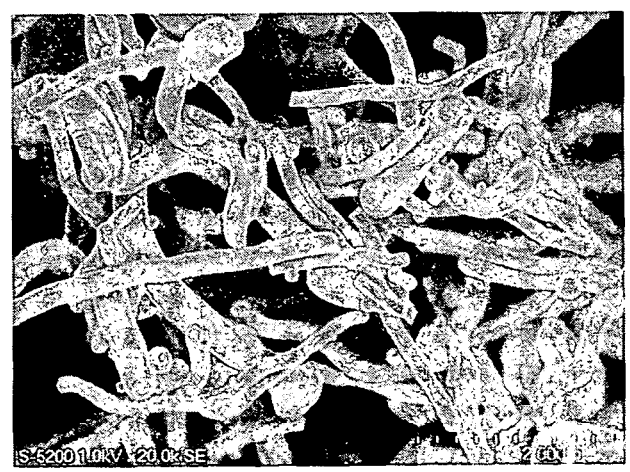
FIG. 10 is a photo of the chiral mesoporous silica in the present invention obtained in Example 5 by FE-SEM.

Further, the obtained mesoporous silica was observed with FE-SEM, and rod-like particles were observed to have a twisted form. The observation result is shown in FIG. 10. This shows that the two-dimensional channel of the 2d-hexagonal p6mm structure is arranged helically along the outward appearance of the twist, and a chiral mesoporous silica was obtained. Particles were randomly selected and counted regarding the direction of the twist of this chiral mesoporous silica, and the ratio of the sinistrality to the dextrality was 60/40.

EXAMPLE 6

Production of Chiral Mesoporous Silica

Here is shown an example in which the maturing temperature of 30° C. was changed to 32° C. as a comparison to the above-described Example 4.

0.4 g of N-myristoyl-L-alanine sodium surfactant ($C_{14}$-L-AlaS) was dissolved in 42.7 g of water and 1.8 g of 0.1N hydrochloric acid, and uniformed at room temperature, then a mixture of 1.96 g of tetraethyl orthosilicate (TEOS) and 0.31 g of N-trimethoxysilylpropyl-N,N,N-trimethylammonium chloride (TMAPS) was added and stirred for 5 minutes. The stirring of the solution was stopped, and after maturing the solution by keeping still at 32° C. for 2 hours, the solution was kept still at 80° C. for 15 hours to give a white precipitate in the solution. This precipitate was filtered by suction filtration, dried at 100° C. overnight to give a chiral mesoporous silica complex. This mesoporous silica complex was calcinated at 600° C. for 6 hours to give the objective chiral mesoporous silica.

In the x-ray diffraction pattern of this mesoporous silica complex, two diffraction peaks were observed in the 2θ range of 1 to 5 and they were indexed as 10 and 11 of a 2d-hexagonal p6mm structure. In the obtained mesoporous silica complex, it was confirmed that a two-dimensional channel of a 2d-hexagonal p6mm structure was formed. In the case of a mesoporous silica shell, it was suggested that the periodic regularity is high. However, the high-order diffraction lines which identify a meso structure are not clear, and it is considered to be a structure in which channels of mesopore are arranged in a disorderly manner. From this, it is considered that a 2d-hexagonal p6mm structure and a structure in which channels of mesopore are arranged in a disorderly manner are existing together.

Figure 11:
FIG. 11 is a photo of the chiral mesoporous silica in the present invention obtained in Example 6 by FE-SEM.

Further, the obtained mesoporous silica was observed with FE-SEM, and rod-like particles were observed to have a twisted form. The observation result is shown in FIG. 11. Further, axes of the rod-like particle were observed to be twisted in spiral form and rod-like particle were observed to be twisted in intermediate level. This shows that the two-dimensional channel of the 2d-hexagonal p6mm structure is arranged helically along the outward appearance of the twist, and a chiral mesoporous silica was obtained. Particle were randomly selected and counted regarding the direction of the twist of this chiral mesoporous silica, and the ratio of the sinistrality to the dextrality was 60/40.

EXAMPLE 7

Production of Chiral Mesoporous Silica

Here is shown an example in which the maturing temperature of 30° C. was changed to 40° C. as a comparison to the above-described Example 4.

0.4 g of N-myristoyl-L-alanine sodium surfactant ($C_{14}$-L-AlaS) was dissolved in 42.7 g of water and 1.8 g of 0.1N hydrochloric acid, and uniformed at room temperature, then a mixture of 1.96 g of tetraethyl orthosilicate (TEOS) and 0.31 g of N-trimethoxysilylpropyl-N,N,N-trimethylammonium chloride (TMAPS) was added and stirred for 5 minutes. The stirring of the solution was stopped, and after maturing the solution by keeping still at 40° C. for 2 hours, the solution was kept still at 80° C. for 15 hours to give a white precipitate in the solution. This precipitate was filtered by suction filtration, dried at 100° C. overnight to give a chiral mesoporous silica complex. This mesoporous silica complex was calcinated at 600° C. for 6 hours to give the objective chiral mesoporous silica.

From the x-ray diffraction pattern, it was suggested that the mesoporous complex has high periodic regularity. However, the high-order diffraction lines which identify a meso structure are not clear, and it is considered to be a structure in which channels of mesopore are arranged in a disorderly manner. No peaks were observed in the mesoporous silica shell, and the meso structure is considered to be collapsed by the calcinations at 600° C.

Figure 12:
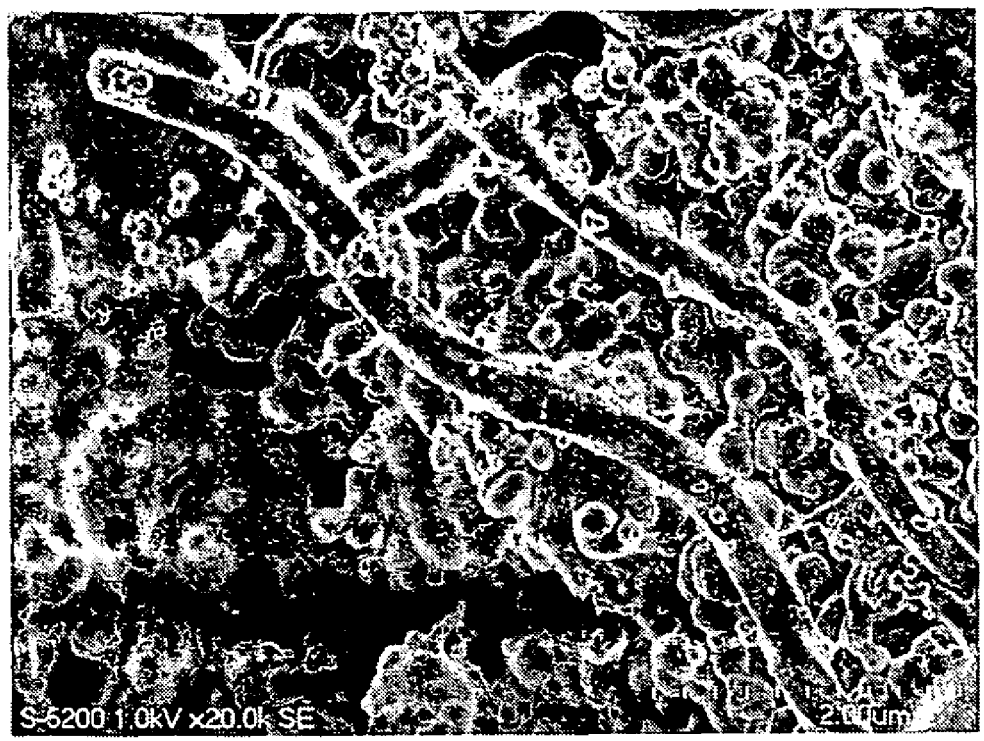
FIG. 12 is a photo of the chiral mesoporous silica in the present invention obtained in Example 7 by FE-SEM.

As shown in FIG. 12, the mesoporous silica obtained in this example was observed with FE-SEM, and among the amorphous particles, a small number of twisted rod-like particles were observed. The direction of the twist of the chiral mesoporous silica was not able to be determined because the number of the twisted rod-like particles was small.

EXAMPLE 8

Production of Chiral Mesoporous Silica

Keeping still at 80° C. for 15 hours in Example 4 was changed to keeping still for 20 hours.

0.4 g of N-myristoyl-L-alanine sodium surfactant ($C_{14}$-L-AlaS) was dissolved in 42.7 g of water and 1.8 g of 0.1N hydrochloric acid, and uniformed at room temperature, then a mixture of 1.96 g of tetraethyl orthosilicate (TEOS) and 0.31 g of N-trimethoxysilylpropyl-N,N,N-trimethylammonium chloride (TMAPS) was added and stirred for 5 minutes. The stirring of the solution was stopped, and after maturing the solution by keeping still at 30° C. for 2 hours, the solution was kept still at 80° C. for 20 hours to give a white precipitate in the solution. This precipitate was filtered by suction filtration, dried at 100° C. overnight to give a chiral mesoporous silica complex. This mesoporous silica complex was calcinated at 600° C. for 6 hours to give the objective chiral mesoporous silica shell.

Figure 13:
FIG. 13 is a photo of the chiral mesoporous silica in the present invention obtained in Example 8 by FE-SEM.

As shown in FIG. 13, the mesoporous silica obtained in this example was observed with FE-SEM, and in addition to twisted rod-like particles, number of spiral particles with the twisted axes were observed. This shows that the obtained chiral mesoporous silica has two types of forms, a twisted rod type and a twisted spiral type, and it was suggested that the percentage of the spiral particles increases with the synthesis time.

INDUSTRIAL APPLICABILITY

The present invention is an inorganic mesoporous material having a chiral twisted structure and is useful not only for the separation and production of optically active materials, but also as a material, a template and the like used in various kinds of nano-technology because the inorganic mesoporous material having a chiral twisted structure in the present invention has an orderly helical and porous nano-scaled structure. Furthermore, it has chirality and opens up a new field in optically active nano-technology. Therefore, the present invention has very broad industrial applicability in the field of optically active materials, the utilization field of mesoporous, and the field of nano-technology.

The invention claimed is:

1. A process for producing an inorganic mesoporous material having a chiral twisted structure comprising polymerizing in the presence of an acid one or two or more polymerizable inorganic monomers selected from the group consisting of polymerizable inorganic monomers and polymerizable inorganic monomers having a functional group capable of having a charge in the presence of a solvent using self-assembly of a chiral anionic surfactant as a template.

2. The process according to claim 1, wherein the chiral anionic surfactant is a chiral N-higher alkanoyl-amino acid salt.

3. The process according to claim 1, wherein the functional group capable of having a charge in the polymerizable inorganic monomers having a functional group capable of having a charge is an amino group or a substituted amino group.

4. The process according to claim 1, wherein the polymerizable inorganic monomers having a functional group capable of having a charge is alkoxysilane having an amino group or a substituted amino group.

5. The process according to claim 1, wherein the solvent is water or a mixed solvent of water and an organic solvent having compatibility with water.

6. The process according to claim 1, wherein the amount of the acid present is 0.05 to 0.5 of the chiral anionic surfactant in molar ratio.

7. The process according to claim 1, wherein the amount of the acid present is 0.1 to 0.2 of the chiral anionic surfactant in molar ratio.

8. The process according to claim 1 comprising a step of removing the self-assembly of the chiral anionic surfactant as a template.

9. The process according to claim 8, wherein a process for removing the self-assembly of the chiral anionic surfactant as a template is by calcination.

10. A chiral inorganic mesoporous material characterized by being composed of a substantially inorganic polymer having a chiral twisted structure, and being mesoporous, which can be produced with a process according to claim 1.

11. The chiral inorganic mesoporous material according to claim 10, wherein the inorganic mesoporous material is in the state of containing the chiral surfactant as a template.

12. The chiral inorganic mesoporous material according to claim 10, wherein the inorganic mesoporous material is a material which the chiral surfactant as a template has been removed.

13. The chiral inorganic mesoporous material according to claim 10, wherein the inorganic polymer is a polymer of a silicon-containing compound.

14. The chiral inorganic mesoporous material according to claim 13, wherein the polymer of a silicon-containing compound is silica.

* * * * *